United States Patent
Tseitlin et al.

(10) Patent No.: US 8,405,393 B2
(45) Date of Patent: Mar. 26, 2013

(54) EPR USING FRANK SEQUENCE

(75) Inventors: Mark Tseitlin, Denver, CO (US);
Richard Quine, Littleton, CO (US);
George Rinard, Longmont, CO (US);
Gareth Eaton, Denver, CO (US);
Sandra Eaton, Denver, CO (US)

(73) Assignee: Colorado Seminary, which owns and operates the University of Denver, Denver, CO (US)

(*) Notice: Subject to any disclaimer, the term of this patent is extended or adjusted under 35 U.S.C. 154(b) by 0 days.

(21) Appl. No.: 12/942,386

(22) Filed: Nov. 9, 2010

(65) Prior Publication Data

US 2011/0210737 A1 Sep. 1, 2011

Related U.S. Application Data

(60) Provisional application No. 61/309,346, filed on Mar. 1, 2010.

(51) Int. Cl.
*G01V 3/00* (2006.01)

(52) U.S. Cl. .................................................. 324/307

(58) Field of Classification Search ........... 324/300–322
See application file for complete search history.

(56) References Cited

U.S. PATENT DOCUMENTS

| | | | |
|---|---|---|---|
| 5,068,611 A | | 11/1991 | Savelainen |
| 5,739,690 A | * | 4/1998 | Rinard ........................... 324/321 |
| 6,046,586 A | * | 4/2000 | Rinard ........................... 324/300 |
| 6,150,817 A | * | 11/2000 | Lurie et al. ..................... 324/318 |
| 2009/0310703 A1 | * | 12/2009 | Han et al. ....................... 375/295 |
| 2011/0241667 A1 | * | 10/2011 | Blumich et al. ............... 324/303 |

FOREIGN PATENT DOCUMENTS

EP 567116 B1 7/2000

OTHER PUBLICATIONS

Quine, R.W. et al., A Pulsed and Continuous Wave 250 MHz Electron Paramagnetic Resonance Spectrometer. Magn. Reson. Engineer. 15 (2002) 59-91.
Blümich, B. et al., NMR with excitation by Frank sequences. J. Magn. Reson. 199 (2009) 18-24.
Owenius, R. et al. Frequency (250 MHz to 9.2 GHz) and Viscosity Dependence of Electron Spin Relaxation of Triarylmethyl Radicals at Room Temperature. J. Magn. Reson. 172 (2005) 168-175.
Morton, J.J.L. et al., Solid-state quantum memory using the 31P nuclear spin. Nature 455 (2008) 1095-1088.
Joshi, J.P. et al., Rapid-Scan EPR with Triangular Scans and Fourier Deconvolution to Recover the Slow-Scan Spectrum. J. Magn. Reson. 175 (2005) 44-51.
Stoner, J.W. et al., Direct-detected rapid-scan EPR at 250 MHz. J. Magn. Res. 170 (2004) 127-135.
Tseitlin, M. et al., Background Removal Procedure for Rapid Scan EPR. J. Magn. Reson. 196 (2009) 48-53.
Quine, R.W. et al., Fast-Response VHR Pulsed 2 KW Power Amplifiers. Conc. Magn. Reson. B (Magn. Reson. Engin.) 29B (2006) 185-190.
Quine, R.W. et al., Fast-response VHF pulsed power amplifiers. Conc. Magn. Reson. B (Magn. Reson. Engin.) 27B (2005) 1-7.

(Continued)

*Primary Examiner* — Dixomara Vargas
(74) *Attorney, Agent, or Firm* — Kilpatrick Townsend & Stockton, LLP

(57) ABSTRACT

Various systems and methods for detecting electron spins using electron paramagnetic resonance are described. An excitation signal generator configured to generate an excitation signal of varying amplitude and phase as compared to a reference signal may be present. A crossed loop resonator configured to isolate a detection signal produced by the excitation signal exciting an object with a magnetic field may also be preset. Further, a detection device configured to detect electron spins of the object using the detection signal isolated by the crossed loop resonator may be present.

14 Claims, 10 Drawing Sheets

OTHER PUBLICATIONS

Rinard, G.A. et al, 250 MHz Crossed Loop Resonator for Pulsed Electron Paramagnetic Resonance. Magn. Reson. Engineer. 15 (2002) 37-46.

International Search Report and Written Opinion of PCT/US2011/026231 mailed on Apr. 20, 2011, 8 pages.

* cited by examiner

EPR USING FRANK SEQUENCE

CROSS-REFERENCES TO RELATED APPLICATIONS

This application claims the benefit of U.S. Provisional Application No. 61/309,346, filed on Mar. 1, 2010, the complete disclosure of which is hereby incorporated by reference.

GOVERNMENT RIGHTS

The U.S. Government may have rights to the content of this application as provided for by the terms of Grant Number P41EB002034 awarded by National Institute of Biomedical Imaging and Bioengineering.

Embodiments described herein were supported by Grant Number P41EB002034 awarded by National Institute of Biomedical Imaging and Bioengineering, The content is solely the responsibility of the Applicants and does not necessarily represent the official views of the National Institute of Biomedical Imaging and Bioengineering or the National Institutes of Health.

BACKGROUND OF THE INVENTION

Nuclear Magnetic Resonance Imaging (NMRI), also referred to as Magnetic Resonance Imaging (MRI) provides ways of imaging various objects, including organic objects, such as the human body, noninvasively. NMRI relies on strong magnetic fields that align the spins of atomic nuclei, such as the nuclei of hydrogen atoms present in water, in the object being studied. The resulting rotating magnetic field created by the atoms in response to the applied magnetic field may allow for an image of the internal structure of the object being studied to be created.

In NMRI, when the magnetic field is applied to the object being studied, the atoms of the object may remain in an aligned state for several hundred microseconds or longer. This may allow enough time for a magnetic field to be applied to the object under study, the source of the magnetic field to be deactivated, and the resulting rotating magnetic field created by the atoms of the object under study to be detected and measured.

One characteristic of NMRI which may be considered a drawback is that a large amount of power may be necessary in order to produce the necessary magnetic fields to align the spin of the nuclei of the atoms of the object under study. For example, an MRI machine found in a medical setting, such as a hospital, may consume more than one kilowatt of power when the MRI machine is active.

BRIEF SUMMARY OF THE INVENTION

Various systems, methods, and devices are described herein for detecting electron spins using electron paramagnetic resonance. In some embodiments, a system for detecting electron spins using electron paramagnetic resonance is described. The system may include an excitation signal generator configured to generate an excitation signal of varying amplitude and phase as compared to a reference signal. The system may include a crossed loop resonator configured to isolate a detection signal produced by the excitation signal exciting an object with a magnetic field. The system may also include a detection device configured to detect electron spins of the object using the detection signal isolated by the crossed loop resonator.

In some embodiments, the system contains additional elements: The excitation signal may be generated using a Frank sequence. The detection device may be further configured to measure electron spins of the object using the detection signal isolated by the crossed loop resonator within three times T2. The detection device may be further configured to measure electron spins of the object using the detection signal isolated by the crossed loop resonator less than 5 microseconds after excitation signal has excited the object with the magnetic field. The object may be placed within the crossed loop resonator. A first module for cross-correlating the detection signal with the Frank sequence may be present. A second module for determining a FID of the object may be present. The object may be an organic object, and the organic object has had a foreign substance introduced to it such that at least a portion of the electron spins of the organic object measured are electron spins of the foreign substance introduced to the organic object. The power level of the excitation signal may be inversely proportional to the resonator efficiency to yield B1 sufficient for turning angles of 90 o/n. The power level of the excitation signal may be less than 50 Watts.

In some embodiments, a method of detecting electron spins using electron paramagnetic resonance is described. The method may include creating a continuous wave excitation signal having a varying phase as compared to a reference signal. The method may include applying the continuous wave excitation signal to an object. The method may include isolating a detection signal created by the continuous wave excitation signal exciting the object with a magnetic field. The method may include also detecting electron spins of the object using the detection signal.

Embodiments of methods may also include other elements: A crossed loop resonator may be used to isolate the detection signal created by the excitation signal exciting the object with the magnetic field. The excitation signal may be created using a Frank sequence. The method may include cross-correlating the detection signal with the Frank sequence. The method may include determining an impulse response of the object. An amount of time that elapses between applying the excitation signal to the object and detecting electron spins of the object using the detection signal may be within three times T2. The power level of the excitation signal may be inversely proportional to the resonator efficiency to yield B1 sufficient for turning angles of 90 o/n. The object is may be an organic object and the method further comprises introducing a foreign substance to the organic object such that at least a portion of the detected electron spins of the organic object are electron spins of the foreign substance introduced to the organic object.

In some embodiments, a system for detecting electron spins in an object is presented. The system may include means for generating an excitation signal of varying amplitude and phase as compared to a reference signal. The system may include means for isolating a detection signal produced when the excitation signal creates a magnetic field that excites electron spins of the object. The system may include means for detecting the detection signal.

Embodiments of the system may also include other elements: The excitation signal may be generated using a Frank sequence. The detection signal may be detected less than 5 microseconds after the excitation signal creates the magnetic field that excited electron spins of the object. The excitation signal may have a power level inversely proportional to the resonator efficiency to yield B1 sufficient for turning angles of 90 o/n. The excitation signal may have a power level of less than 500 Watts when the excitation signal creates the magnetic field that excites electron spins of the object. The system may further include means for cross-correlating the detection signal with the Frank sequence. The system may further include means for determining an FID of the object.

In some embodiments, a system for detecting electron spins using electron paramagnetic resonance may be present. The system may include an excitation signal generator configured to generate an excitation signal of varying amplitude and phase as compared to a reference signal, wherein the excitation signal has a power level of less than 100 Watts. The system may include a resonator configured to isolate a detection signal produced by the excitation signal exciting an object with a magnetic field. The system may also include a detection device configured to detect electron spins of the object using the detection signal isolated by the crossed loop resonator.

DETAILED DESCRIPTION OF THE INVENTION

Figure 1:
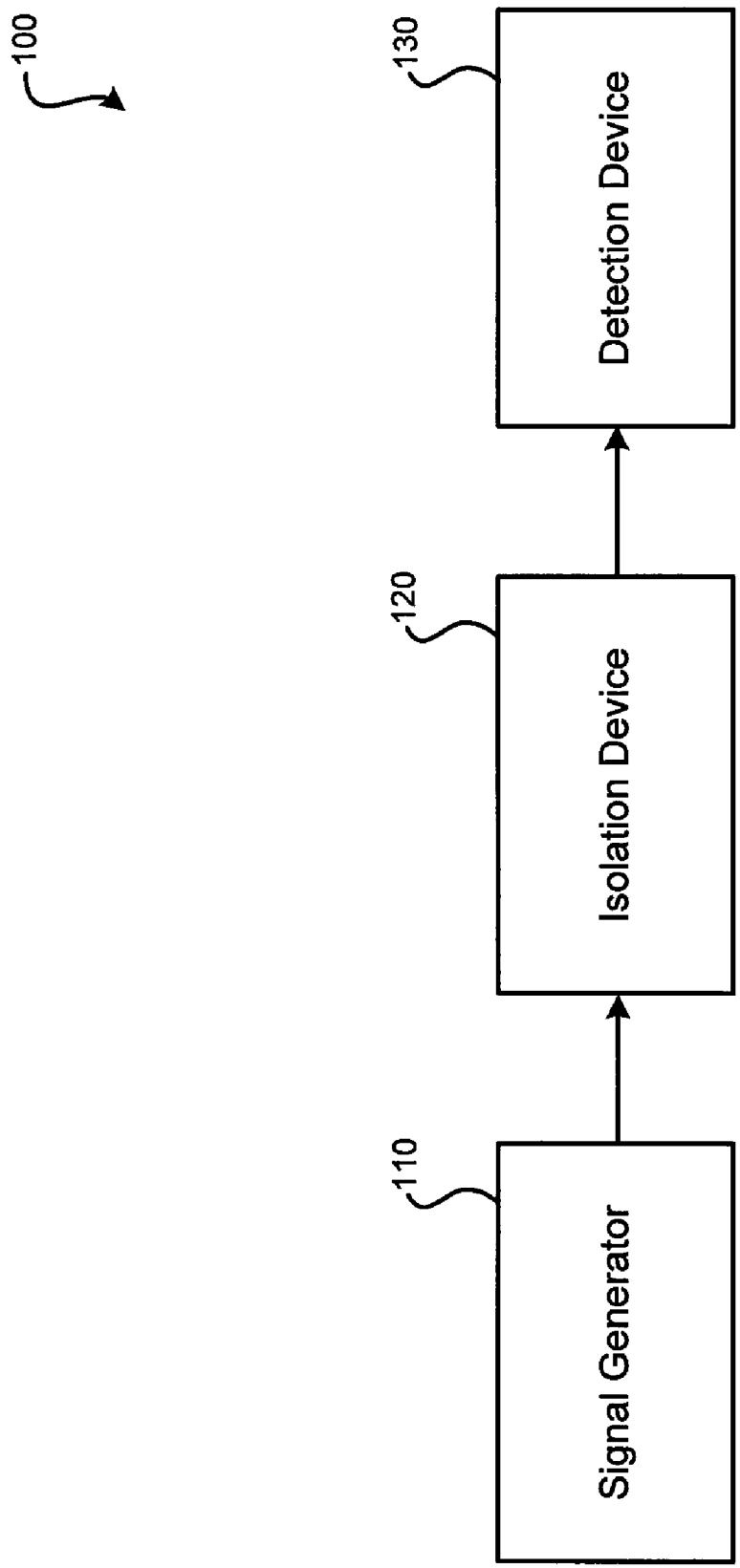
FIG. 1 illustrates a simplified block diagram of a system for measuring electron spins using Electron Paramagnetic Resonance (EPR).

Similar to NMRI, Electron Paramagnetic Resonance (EPR) may allow for the imaging of various objects, including organic objects, such as the human body, noninvasively. However, EPR differs in many respects from NMRI. EPR measurements may be used for imaging the location of electron spins and for imaging objects that affect the EPR measurements. Rather than observing the magnetic fields as produced by the spins of atoms' nuclei, EPR relies on the behavior of the electrons of atoms. In short, EPR relies on a magnetic field being applied to an object being studied, followed by the spectra produced by changes in energy level of unpaired electrons of the atoms (which have an unpaired electron) of the object under study being detected and measured.

EPR may be considered to have several difficulties necessary to be overcome that are not present (or as pronounced) in NMRI. One of these difficulties relates to the relaxation time of electrons as compared to the nuclei of atoms. After being excited, the nuclei of atoms may take several hundred microseconds or more the return to their relaxed state. This may allow for a significant window of time for the nuclei to be observed in their excited states (their spins aligned) while allowing for an amount of time to pass between when the magnetic field was applied to the object under study and when the spin of the nuclei of the atoms of the object is measured. In contrast, the relation times of electrons may be much shorter, possibly by multiple orders of magnitude. Therefore, in EPR, after an unpaired electron of an atom has been excited, the electron may return to its relaxed state after roughly three microseconds or less. Therefore, the amount of time available to detect the excited electrons is significantly shorter in EPR than NMRI. Accordingly, while in NMRI it may be possible to allow a significant amount of time (e.g., tens or hundreds of microseconds) to pass between when the magnetic field is applied to the object and when the nuclei spins are observed, this time period may be greatly shortened with EPR is used.

Some current techniques for EPR may require large amounts of power being incident on the object being studied. In some embodiments described herein, RF/microwave power required to perform pulsed EPR is reduced. High power amplifiers may be expensive and carry the burden of ensuring that the in vivo imaging technology is designed to prevent excessive absorption of RF/microwave power by the object being imaged (in MRI this may be referred to as the Specific Absorption Rate). Currently, there are FDA regulations that limit SAR. The use of the Frank sequence in EPR may allow for a significant reduction in SAR.

In some embodiments, a crossed loop or bimodal resonator can be used to isolate the detected EPR signal from the incident pulses or continuous incident wave containing phase change intervals. Such isolation devices may allow for a short time period, referred to as the "dead time," to elapse between when the microwave signal is used to excite unpaired electrons and when the spectra emitted by those electrons may be observed.

The use of Frank sequences in generating the microwave signal applied to the object being studied and the use of an isolation device, such as a crossed-loop resonator, to isolate the signal generated by the excited unpaired electrons of the object, may allow for EPR to be used to image objects. Further, such an arrangement may allow for the microwave signal applied to the object to be of a comparatively low power. For example, when a small object is under study, a signal of +10 dBm may be sufficient to excite the electrons.

FIG. 1 illustrates a simplified block diagram of a system 100 for measuring electron spins using EPR. Such a system may be used for in vivo measuring and also for measuring non-living objects. System 100 may include at least three components: a signal generator 110, an isolation device 120, and a detection device 130. Signal generator 110 may generate an excitation signal, such as a microwave signal (also referred to as an RF signal), that is used to excite electron spins in an object, such as an organic object or chemical sample, being studied. Isolation device 120 may serve to isolate the excitation signal being applied to the object from overwhelming (or damaging) detection device 130. Detection device 130, concurrently with signal generator 110 applying the excitation signal or shortly after the excitation signal has been powered down, may receive a detection signal emitted by the electrons of the object excited by the excitation signal.

Signal generator 110 may produce an excitation signal. This excitation signal may have a varying phase (as compared to a reference signal) and/or amplitude. In order to achieve the speed of phase changes necessary (especially if a Frank sequence is used), the signal generator may include an arbitrary wave generator (AWG). Besides an AWG, it may be possible to generate the excitation signal using some other signal generator, such as a signal generator specifically configured to produce an excitation signal having the necessary amplitude and phase shifts required by the Frank sequence in use. Depending on the object being studied, the output of signal generator 110 may or may not be amplified. For example, an AWG may be capable of outputting a signal strength of +10 dBm. In some instances, this may be sufficient to create a powerful enough excitation signal to apply directly to the object being studied. In these instances, because no other amplification is necessary, the number of analog components may be significantly reduced (e.g., the elimination of amplifiers and attenuators), thus almost creating a fully digital EPR spectrometer.

In some embodiments of signal generator 110, various analog attenuators and amplifiers may be present. In some embodiments, an AWG, or other device configured to produce excitation signals that change phase and/or amplitude quickly, may be connected to one or more amplifiers and one or more attenuators. These amplifiers and attenuators may be used to achieve the desired signal strength output from the excitation signal generator as the excitation signal.

Isolation device 120 may isolate the excitation signal generated by signal generator 110 from adversely affecting measurements taken of the spectra produced by the object under study when excited by the excitation signal. Due to the large difference in the power level of the excitation signal generated by signal generator 110 (such as +10 dBm) and the spectra radiated by the object when exposed to the excitation signal, it may be difficult to observe the spectra produced by an object while (or immediately after) signal generator 110 is applying the excitation signal to the object under study without the use of isolation device 120.

Isolation device 120 may be a crossed-loop resonator. A possible crossed-loop resonator that may be used is described in U.S. Pat. No. 6,046,586, entitled "Crossed-Loop Resonator Structure for Spectroscopy," the entire disclosure of which is hereby incorporated for all purposes. Such a crossed-loop resonator may allow for the excitation signal to be applied to the object being studied while allowing the spectra emitted by the unpaired electrons of the object to be observed concurrently or shortly thereafter by detection device 130. Allowing for the spectra to be observed shortly concurrently or immediately thereafter may be important in the context of EPR: the spin relaxation times of electrons may be short, possibly on the order of a thousand times shorter than nuclear spin relaxation times used in NMRI. This greatly reduces the available window to observe the effects of the excitation signal being applied to the object. Therefore, in order for such EPR spectra to be observed, the spectra must be observed either concurrently with the excitation signal being applied, or shortly thereafter (e.g., 3 or fewer microseconds).

Detection device 130 may be used to detect and measure the spectra emitted by the unpaired electrons of the object being studied. As an example, a digitizer, such as a Bruker Specjet Digitizer may be used. Such a digitizer may be an eight bit digitizer. Higher bit digitizers may also be possible, such as ten and twelve bit digitizers. It should be understood that a specialized device may be employed to perform similar detection functions such as a digitizer for detecting the EPR spectra of the object being studied. The detection signal that is detected by detection device 130 received from the object via isolation device 120 may be amplified before being received by detection device 130. For example, a low noise amplifier may be used to boost the amplitude of the detection signal before it is detected and measured by detection device 130. The detection device may be a digital detection device, which may have orthogonal signal channels.

Figure 2:
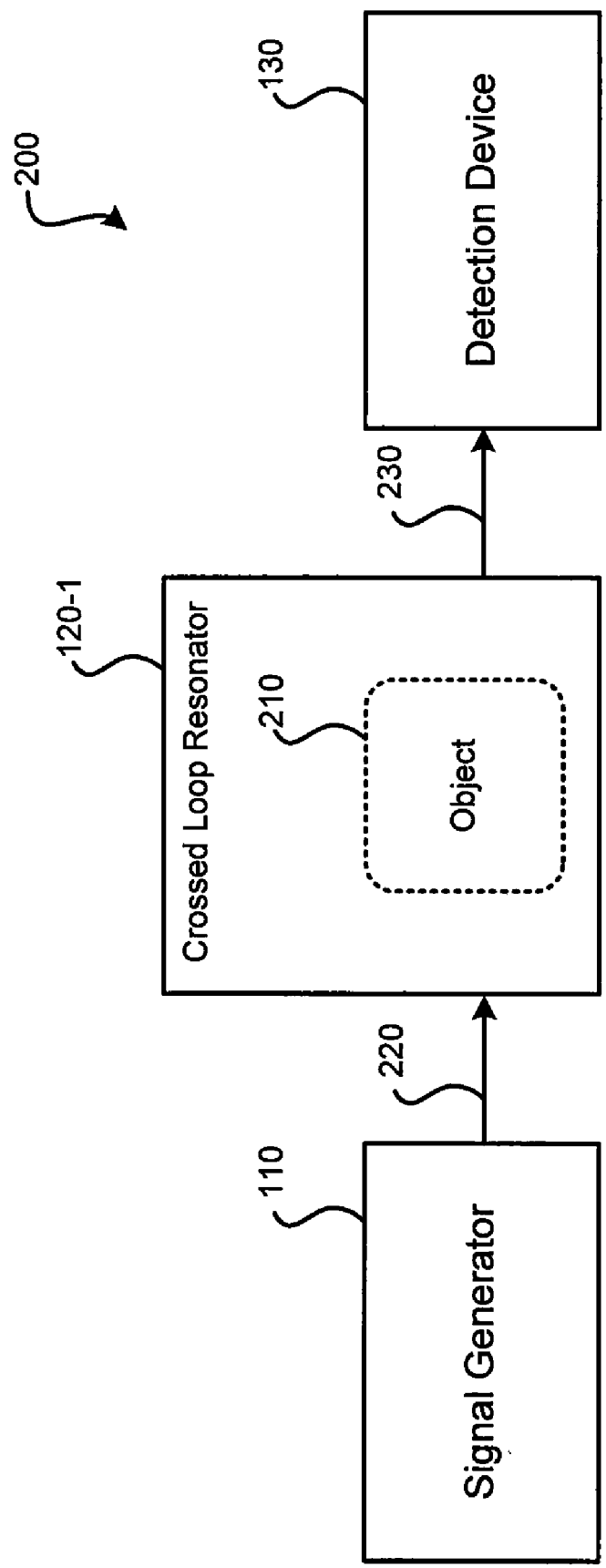
FIG. 2 illustrates a simplified block diagram of a system for measuring electron spins using EPR and a Frank sequence (FS).

FIG. 2 illustrates a simplified block diagram of a system 200 for measuring electron spins using EPR and a Frank sequence. System 200 may represent a more detailed view of system 100, or may represent a different system. Signal generator 110 of FIG. 2 may represent signal generator 110 of FIG. 1. Excitation signal 220 produced by signal generator 110 may involve a Frank sequence. The use of a Frank sequence in producing excitation signal 220 may allow for the excitation signal to be of lower power than if the excitation signal was an impulse. A Frank sequence is a multi-phase sequence that has a periodic autocorrelation function. Such coded pulse sequences may be useful in distinguishing signals from noise. In a linear system, an impulse may be applied to a system to determine its impulse response. As opposed to applying an impulse to the linear system, a Frank sequence may be applied. The output of the linear system may be the convolution of the impulse response with the Frank sequence as represented by equation 1. When the result of equation 1 is correlated with the Frank sequence, the impulse response of the linear system may be determined (because a Frank sequence correlated with itself is represented by an impulse), as presented in equation 2.

$$FS \xrightarrow{\text{LinearSystem}} h * FS \qquad \text{Eq. 1}$$

$$(h * FS) \oplus FS = h * (FS \oplus FS) = h \qquad \text{Eq. 2}$$

In the case of EPR, h is the free induction decay (FID) of the unpaired electrons of the object. Therefore, the result of the correlation is the free induction decay (FID) of the unpaired electrons of the object excited by the excitation signal.

Excitation signal 220 produced using a Frank sequence may be applied to an object 210 being studied. Excitation signal 220 may be a series of pulses or may be a continuous signal having phase change intervals. Object 210 may be partially or completely within crossed loop resonator 120-1. Crossed-loop resonator 120-1 may represent isolation device 120 of FIG. 1. Object 210 may be living or part of a living organism (e.g., organic). Object 210 may also be some inorganic material, such as a chemical sample. Crossed loop resonator 120-1 may allow excitation signal 220, produced using a Frank sequence, to be applied to object 210 shortly before (or possibly concurrently with) the detection of the spectra emitted by the unpaired electrons of object 210. Crossed loop resonator may include an excitation resonator and a detection resonator. Without the isolation of crossed loop resonator 120-1, it may be necessary to have a longer period of time elapse between when excitation signal 220 is applied to object 210 and when the spectra emitted by unpaired electrons of object 210 are detected. However, due to short electron spin relaxation times, waiting this extra amount of time may not be possible.

Detection signal 230 represents the spectra emitted by the unpaired electrons of object 210. Detection signal 230 may exit crossed loop resonator 120-1 via a different resonator chamber than excitation signal 220 was applied. Excitation signal 220 may be applied to the excitation chamber of crossed-loop resonator 120-1, while detection signal 230 is emitted from a detection chamber of crossed-loop resonator 120-1. In some embodiments, detection signal 230 is amplified before being received by detection device 130. Detection device 130 may receive detection signal 230 and may measure and detect the spectra emitted by the unpaired electrons of object 210.

Figure 3:
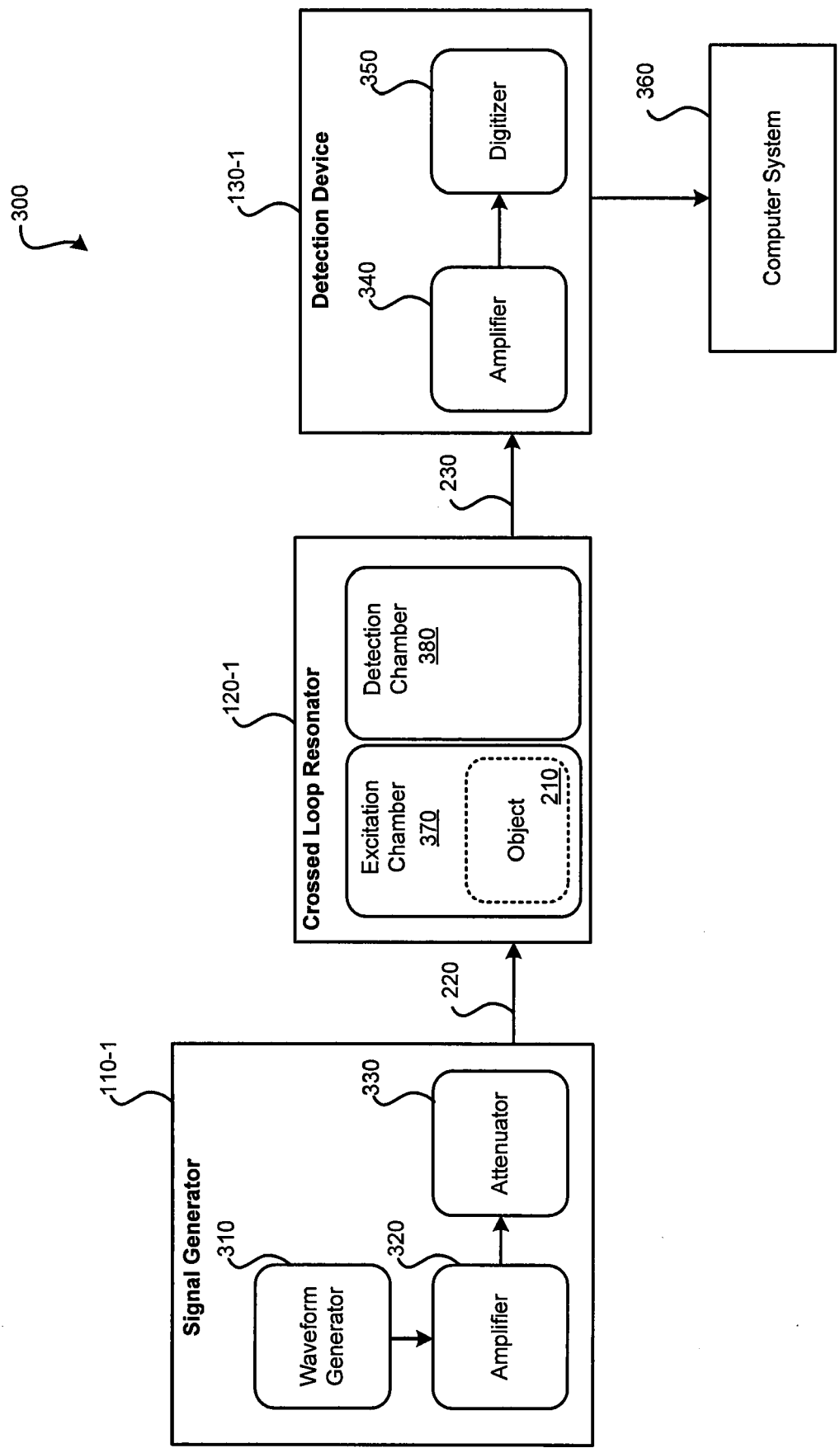
FIG. 3 illustrates another simplified block diagram of a system for measuring electron spins using EPR and a Frank sequence.

FIG. 3 illustrates another simplified block diagram of a system 300 for measuring electron spins using EPR in conjunction with a Frank sequence. Signal generator 110-1 may represent signal generator 110 of FIGS. 1 and 2, or may represent some other signal generator. In system 300, signal generator 110-1 includes several components: excitation signal generator 310, amplifier 320, and attenuator 330. Excitation signal generator 310 may form the initial waveform of excitation signal 220-1. This excitation signal may be created using a Frank sequence. Excitation signal 220-1 may be either a series of pulses or a continuous RF signal containing phase change intervals. Excitation signal generator 310 may be connected with a computer system which specifies the phase, amplitude, and frequency necessary to form the excitation signal using the Frank sequence. In some embodiment, a MATLAB program is used to program the waveform generator 310 to produce the waveform. Excitation signal generator 310 may be an arbitrary excitation signal generator, or some other piece of equipment or device capable of generating the excitation signal using a Frank sequence. The excitation signal produced by excitation signal generator 310 may then be received by amplifier 320. Amplifier 320 may be used to increase the amplitude of the excitation signal up to the maximum amplitude that may be desired to be applied to object 210. The output of amplifier 320 may then be received by attenuator 330. Attenuator 330 may be a variable attenuator, thus allowing the amplitude of excitation signal 220-1 applied to object 210 to be varied. In some embodiments, amplifier 320 and attenuator 330 may not be necessary. Rather the output of excitation signal generator 310 may be applied directly to object 210 as excitation signal 220-1 without amplification and/or attenuation.

Excitation signal 220-1 output from signal generator 110-1, which may represent the same excitation signal 220 of FIG. 2, or may represent some other excitation signal, may be received by crossed loop resonator 120-1. As previously described, excitation signal 220-1 may be applied to object 210 within crossed loop resonator 120-1. Crossed loop resonator 120-1 may contain multiple chambers, such as excitation chamber 370 and detection chamber 380. Crossed loop resonator 120-1 may be a wire crossed loop resonator, a solid copper crossed loop resonator, or some other type of crossed loop resonator. Excitation chamber 370 may be the chamber where the excitation signal is applied. Detection chamber 380 may be the chamber where the detection signal is observed. Excitation signal 220-1 may excite unpaired electrons of object 210, thereby altering the energy level of those electrons. Crossed loop resonator 120-1 may serve to isolate the emitted spectra of the unpaired electrons from excitation signal 220-1. Excitation signal 220-1 may still be active, or has shortly before stopped being applied to object 210. In some embodiments, excitation signal 220-1 is applied continuously. Detection signal 230-1, which may represent the same detection signal as detection signal 230 of FIG. 2 or may represent some other detection signal, may be received by detection device 130-1. The reception of detection signal 230-1 may occur while excitation signal 220-1 is active.

Detection device 130-1 may represent detection device 130 of FIGS. 1 and 2, or may represent some other detection device. In system 300, an amplifier may be part of detection device 130-1. Detection signal 230-1 may be received by amplifier 340. Amplifier 340 may increase the amplitude of detection signal 230-1. The output of amplifier 340 may then be received by digitizer 350. Digitizer 350 may digitize the analog signal received from amplifier 340. If excitation signal 220-1 is a continuous signal, detection signal 230-1 may be digitized continuously. This digitized signal may then be transmitted to computer system 360 for analysis.

Figure 4:
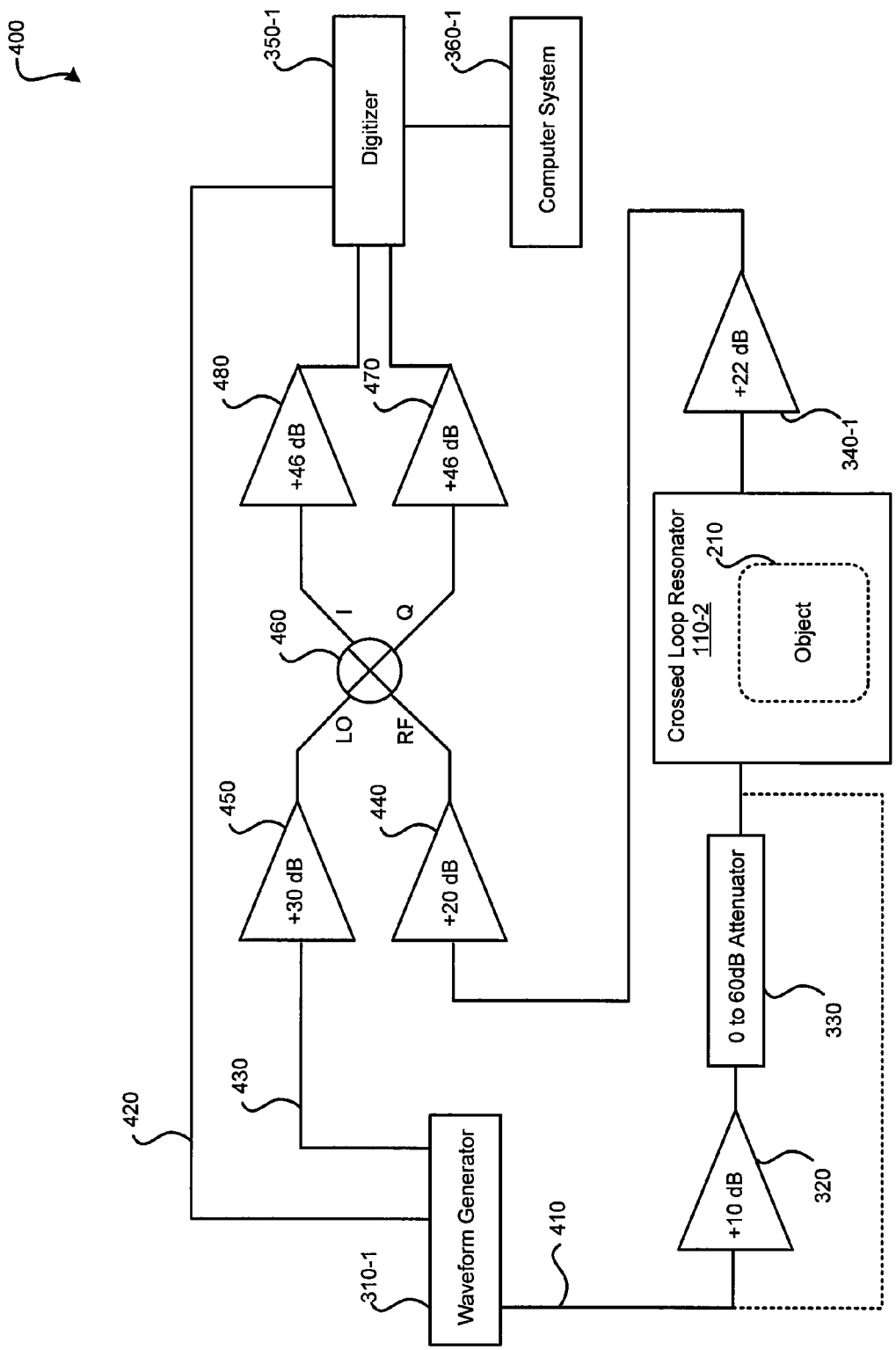
FIG. 4 illustrates a circuit diagram of a system for measuring electron spins using EPR and a Frank sequence.

FIG. 4 illustrates a circuit diagram of a system 400 for measuring electron spins using EPR and a Frank sequence. Waveform generator 310-1 may represent the same waveform generator as waveform generator 310 of FIG. 3, or may represent some other waveform generator. Excitation signal generator 310-1 may generate three signals: an excitation signal 410 (possibly using a Frank sequence), a trigger signal 420, and a reference signal 430. Trigger signal 420 may signal to digitizer 350-1 when to begin and stop measuring the detection signal. Trigger signal 420 may be in the form of one or more pulses. Reference signal 430 may serve as a reference for the phase of excitation signal 410. Therefore, if excitation signal has a 180 degree phase shift, reference signal 430 and excitation signal 410 would have a 180 degree phase shift compared to each other. Reference signal 430 may also have a constant or variable amplitude. Excitation signal generator 310-1, which may be an AWG, may output excitation signal 410 (which may be a series of pulses or a continuous wave) to amplifier 320-1 (which may represent amplifier 320 of FIG. 3 or some other amplifier). Amplifier 320-1 may boost the amplitude of excitation signal 410 10 dB. The output of amplifier 320-1 may be input to attenuator 330-1. Attenuator 330-1 may represent attenuator 330 of FIG. 3 or some other attenuator. Attenuator 330-1 may be a 0 to 60 dB variable attenuator, thus allowing the amplitude of the excitation signal applied to the object to be varied.

In some embodiments, amplifier 320-1 and attenuator 330-1 are not present. Excitation signal generator 310-1 may output an excitation signal of +10 dBm (or greater), which may represent sufficient power to apply to object 210 for EPR spectrospy. Therefore, as represented by the dotted signal path, the excitation signal generated by excitation signal generator 310-1 may be applied directly to object 210 in crossed loop resonator 120-2 as the excitation signal. The unpaired electrons of object 210 may emit spectra as the electrons drop in energy level, thus creating a detection signal. This detection signal may be received by amplifier 340-1. Amplifier 340-1 may represent amplifier 340 of FIG. 3 or some other amplifier. Amplifier 340-1 may amplify the detection signal by 22 dB (or some other amount of amplification).

The output of amplifier 340-1 may be received by amplifier 440 which may amplify the detection signal by 20 dB (or some other amount of amplification). Reference signal 430 may be amplified by amplifier 450 by 30 dB. Using a mixer, such as double balanced, quadrature mixer 460, an in-phase and quadrature-phase detection signal may be created. Each of these detection signals may be amplified by 46 dB (or some other amount of amplification) by amplifiers 470 and 480 and input to digitizer 350-1. Digitizer 350-1, which may represent digitizer 350 of FIG. 3 or some other digitizer, may receive trigger signal 420, and the in phase and quadrature phase detection signals from amplifiers 470 and 480. Digitizer 350-1 may be a Bruker SpecJet or a digital oscilloscope. Digitizer 350-1 may also be implemented by some other device or system designed to serve as a spectrometer for system 400. Digitizer 350-1 may serve to convert (and possibly sum) the analog signals received from amplifiers 470 and 480 to digital signals. Such conversion may happen continuously if the excitation signal is a continuous signal. Analysis of the digitized signals may then be completed using various commercial or specialized software packages at computer system 360-1, which may represent the computer system 360 of FIG. 3.

Example Embodiments

The following represents an embodiment of EPR analysis conducted using various embodiments of the systems described in FIGS. 1-4. As those with skill in the art will recognize, the following only represents possible embodiments and others may be possible.

In one embodiment, the object used was a 0.2 mM aqueous solution of deuterated symmetric trityl (also referred to as Finland trityl)(methyl tris(8-carboxy-2,2,6,6-teramethyl($d_3$)-benzo[1,2-d:4,5-d]bis(1,3)dithiol-4-yl)-tripotassium salt) in a 10 mm outside diameter tube, purged with $N_2$ gas and flame-sealed. This sample has $T_2$ ca. 11 µs.

The excitation signal generator may generate a 256 MHz RF frequency (approximately 9.1 mT magnetic field) using components of a VHF spectrometer and air-core magnet. Isolation (approximately 40 db) of the detected signal from the RF continuous wave or pulses in a wire cross-loop resonator (CLR) was used in this embodiment. In this embodiment, for example, the cross-loop resonator is 16 mm in diameter and 15 mm long and the orthogonal excitation resonator consists of two coils 32 mm in diameter and spaced 20 mm apart. A 10 mm diameter sample was inserted into a 16 mm tube with the annular space filled with water.

The waveform of phase-stepped RF pulses or the waveform of the continuous wave with phase change intervals were generated with a Tektronix arbitrary excitation signal generator, AWG 2041, at about its maximum 1024 MHz clock frequency. A Matlab program was written to produce AWG compatible files to facilitate creating the excitation signals. The 8-bit signal channel was used to form the pulse sequence or continuous wave with phase change intervals. The frequency carrier was one fourth of the clock frequency, so there were only 4 points per sinusoidal cycle. Sets of higher harmonics of the fundamental frequency did not create a problem because the resonator, when tuned to the carrier frequency, acted as a narrow pass filter. Consequently, frequencies beyond the resonator bandwidth were strongly suppressed. One marker output from the AWG was used to produce a constant 256 MHz signal for the LO side of the double-balanced mixer (DBM) used to detect the EPR signal. The harmonics of the reference frequency were eliminated by the limited bandwidth of the lock-in amplifier (approximately 10 MHz). The second marker output was used to trigger the spectrometer digitizer. Synchronization of the signal channel and the two markers by the same AWG clock made possible successive data averaging by a Bruker SpecJet II digitizer that was run at the 250 MS/s sampling rate.

The AWG excitation signal for the Frank sequence (FS), of 256 pulses was computed by means of the Matlab program. Each pulse or phase change interval was formed by 112 points. It was followed by 112 zeros. The total number of points in the excitation signal was 224×256=57,344, which for the 1024 MHz clock frequency is equivalent to duration of 56 µs, which is about $5T_2$ for the trityl radical. The phases of each single pulse or phase change intervals were according to the Frank sequence of $16^2$=256 elements. The length of each pulse (or phase change interval) was about 109 ns, which produced an excitation bandwidth for the resonator of Q about 50 at 250 MHz resonance frequency. The power incident to the crossed-loop resonator was about 1.5 mW. This power was demonstrated to be within a few dB of the optimum for achieving the desired 90°/256 turning angle for the electron spins for the pulse length and the Q of the resonator used. Given the isolation of about 40 db between the excitation and detection CLR resonators, this produced a power in the latter on the order of 100 nW. Such a low power is many orders of magnitude smaller than would occur for a single 90 degree pulse. This power is low enough that it may not damage the detection system, so there may be no need for detector protections. Consequently, the detection signal can be measured right after the Frank sequence pulses have been applied to the object being studied. In spite of the isolation, a background signal (BG) produced by transition effects in the CLR may be larger than the EPR component of the detection signal. In order to eliminate the BG contamination, data were collected for on-resonance and off-resonance conditions followed by subtraction of one from the other. Cleaned from the background component, the signal was cross-correlated with the Frank sequence to produce a FID (Free Induction Decay), the Fourier transform of which revealed the absorption and dispersion components of the EPR spectrum.

In some embodiments, the background signal may not be completely removed from the measured data. The BG noise may be more pronounced for weak EPR signals with short relaxation times. Different kinds of residual BG may produce different kinds of artifacts. When using a Frank sequence, the BG signal basically reproduces a filtered Frank sequence, so cross-correlation with FS produces an FID-like feature in the time domain and an EPR-spectrum-like feature in the frequency domain. To minimize this effect, the resonator Q may be reduced. Lower Q may shorten resonator ringing time, reduces BG signal, and made it possible to decrease "dead time," referring to the amount of time passing from the end of the pulse being applied to the object being studied until the beginning of data measuring by the detection device. If a continuous wave with phase change intervals is being used, there may be no dead time because the detection signal is being measured while the excitation signal is being generated and applied to the object. The optimum Q value may be found depending on experimental conditions: relaxation times, spectral window, spectral resolution, etc. In the test embodiment, a resonator with a non-optimized Q value about 50 was used. The resonator was initially designed for the rapid scan EPR method and was used in these proof-of-principle experiments because it was available. As those with skill in the art will recognize, the resonator may be designed specifically for EPR applications.

In a typical pulse EPR experiment, following an impulse to the resonator, the signal detection system may be overwhelmed for at least five time constants of the resonator impulse response. Further, in practice a much longer delay may be needed until the EPR signal is comparable in intensity with the weakened BG. However, in the case of implementation of Frank sequence EPR methods when a single 90 degree pulse is replaced by a series of low intensity pulses, the EPR signal may be very weak. Given the short relaxation times of paramagnetic species, the observation of EPR signal above the BG may not be possible. For the conditions discussed herein, it has been demonstrated that with BG subtraction FS EPR can be successfully implemented.

Figure 5:
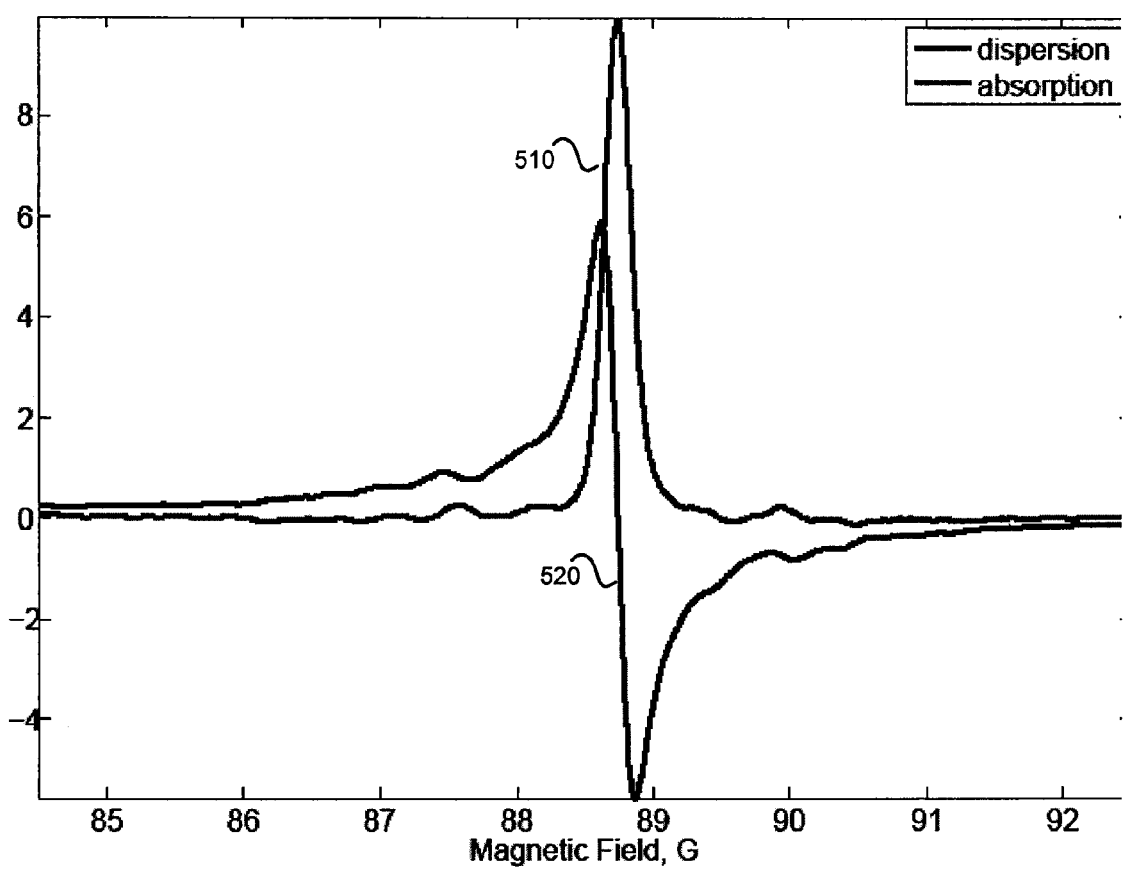
FIG. 5 is a graph of the EPR spectrum of the trityl radical obtained by means of FS EPR method.

When applying Frank sequences to NMR, one single data point of the EPR response to the train of preceding pulses may be measured just before the beginning of the next pulse; so the BG component is minimized. It was found that in the case of EPR, where relaxation times (electrons instead of nuclei) are much shorter, better results may be obtained if more data points were averaged. Since the data were collected continuously, integration could be done in the interval from the end of the pulse to the beginning of the next pulse. FIG. 5 illustrates the result of Frank sequence EPR method when 25 points of the EPR response were averaged in the time window of 100 ns.

Reducing the time window of data averaging added more distortions to the EPR detection signal. As seen in FIG. 5, the distortions may not be quite random. There may be some correlation in the baseline for dispersion and absorption component. This may be because the major contributor to the noise is BG instability, not the thermal noise. In order to improve BG subtraction, on-resonance and off-resonance data were collected repeatedly 40 times. Three full cycles of FS were digitized by SpecJet with 1024 on-board averages. So, the total number of signal averages were 3×40×1024=122,880 for both on-resonance and off-resonance data. The total data acquisition time can be estimated as: 122,880×2×56 μs≈s. Time needed to change the magnetic field from the resonance value to the non-resonance value is not included in the estimation.

Although 1024, or some other value such as 256, pulses for EPR signal detection may be considered large relative to normal pulsed spin echo and saturation recovery EPR, there is precedent for using large numbers of pulses in EPR. Up to 1000 refocusing pulses may be applied in a CPMG sequence.

Since the number of phase angles in the Frank sequence goes as $n^2$ (wherein n is an integer), experiments have been tried with 25, 49, ..., 256, 1024 pulses with different phase angles. Instead of pulses, 25, 49, ..., 256, 1024 phase change intervals of a continuous wave excitation signal may be used. It could be possible to increase the number of pulses (or phase change intervals) even further, because the bandwidth of the resonator, which may serve as a limiting factor.

Spectral resolution may be the reciprocal of the sequence duration. The suggested value is represented by equation 3.

$$\frac{1}{5T_2} \qquad \text{Eq. 3}$$

The resolution may be increased by stretching the sequence to more than 5 times $T_2$. This may be important if the FS EPR method is applied to measure a sample composed of spins having different relaxation times. The example shown here is of a homogenous $O_2$-free solution of trityl. Samples that are composed of species with different relaxation times or are inhomogenous will have different $T_2$ values for different parts of the spectra, and consequently, the intensity and resolution may not be optimized for all parts of the sample simultaneously. The ability to discriminate based on $T_2$ may be an advantage for some studies.

In experiments, it was found that increased BG and consequent distortion of EPR may happen when the CLR resonator is not properly tuned. For better results, both the excitation and detection resonators may require resonant frequencies close to that of the source. Otherwise, after the pulse, each of the resonators may tend to ring on its own self-frequency, resulting in multiple interfering frequencies.

When using Frank sequence of RF pulses (or continuous wave signals with phase change intervals), the BG signal may be significant in size as compared to the EPR component signal. To achieve optimal results, BG reduction may be achieved by increasing isolation between the excitation and detection resonators of the CLR and fast switching of the magnetic field system to decrease delay between on- and off-resonance data collection. In addition, using a lower Q resonator may reduce the dead time.

Although the Frank sequence used in the present application requires that the numbers of phases in the sequences be squares of integers, sequences may have any number of phases and still have the desired correlation properties. In some cases, combined Frank and Chu sequences may have correlation properties similar to the original sets. Thus, the restriction to squares of integers in the present work may not be necessary, and a large number of sequences with desirable correlation properties may be constructed in the future.

There are many paramagnetic species available such that embodiments of the invention are not limited to triaryl methyl radical. These species can include defect centers and/or doped solids, with sufficiently long $T_2$.

FS EPR permits pulsed and continuous FID signal acquisition with very low power microwave/RF pulses. Relative to standard pulsed EPR, which may require high-power pulsed RF/microwave amplifiers, much lower power may be used with the Frank sequence. Relative to normal continuous wave operation, the embodiments described share with normal high-power pulse FID detection the advantage of not scanning the magnetic field and of not requiring magnetic field modulation. Relative to rapid scan EPR, no auxiliary rapid magnetic field scan coils may be required.

In some embodiments, a Frank sequence is a polyphone perfect sequence, which can mean that autocorrelation function of FS is a δ-function. There may be other sequences with that property. Among them: noise, rapid scan EPR driving function, etc. These functions may be used in place of a Frank sequence.

In some embodiments, linearity for the spin system can mean that pulses in the sequence must turn magnetization vector by small turning angles. It has been suggested that the turning angle is (90°)/N, where N is the number of pulses (one suggested number is N=1024, however other numbers are possible). The entire sequence lasts $5*T_2$s. In some embodiments, the limit on a turning angle may be underestimated by an order of magnitude, which means that pulses of larger power can be used to increase the signal to noise ratio. Some possible power levels of the excitation signal being applied to an object are power levels below 500 W, 100 W, 50 W, 10 W, and 5 W. Of course, other power levels are also possible.

In situations involving short relaxation times, the dead time (resonator ringing time, which may be on the order of hundreds of nanoseconds) is comparable to $T_2$. Because of the dead time, the $5*T_2$ constraint on the sequence may reduce the number of pulses that may be used. As a result, each pulse may need a larger amplitude. Possible solutions may include a lower Q and/or Q-spoiling.

In some embodiments, spectral resolution is the reciprocal of the sequence duration. In some embodiments, spectral resolution can be as described in equation 3. In some embodiments, the spectral resolution may be increased by a factor of 5 by stretching the sequence to 25 $T_2$ without signal to noise ratio degradation. This can be useful for oxymetry measuring, where there is a whole spectrum of $T_2$s in one sample, so the condition $5T_2$ might be met only for one particular spin packet.

In some embodiments, Q-effect can be the effect of the resonator Q on the FS sequence and may be taken into account. The FS may be modified in order to compensate the Q-effect, so that spins "see" the undistorted sequence.

In some embodiments, various types of transmission resonators can be used to provide isolation between incident and detected r.f. power. In some embodiments, the Frank sequence can be replaced by one of several related but distinct possible phase sequences, for example, the Chu sequence. The data acquisition and analysis could be extended to include nonuniformly spaced points, including those obtained by superposing multiple data sets.

When a continuous wave excitation signal having phase change intervals is used, the following describes a possible embodiment of applying an excitation signal and creating the final output spectrum. A continuous wave, constant amplitude excitation signal may be generated by the arbitrary waveform generator. The phase of the excitation signal may be adjusted 1024 times according to the Frank sequence during the time T=5T$_2$ time. The clock of the arbitrary waveform generator (or whatever device is used to generate the excitation signal) may be adjusted proportionally (e.g., divided) to match the resonant frequency of the resonator (e.g., a crossed loop resonator). Due to the continuous excitation signal, a detection signal may be created and detected continuously. The detection signal emitted by the detection chamber of the crossed loop resonator may be continuously digitized with a 1 ns sampling period, which may result in four points per cycle for when the carrier frequency is approximately 250 MHz. Therefore, measurement of electron spins of an object using a detection signal isolated by a crossed loop resonator may occur within one, two, three, four or five times T$_2$, to name only a few examples.

Figure 6:
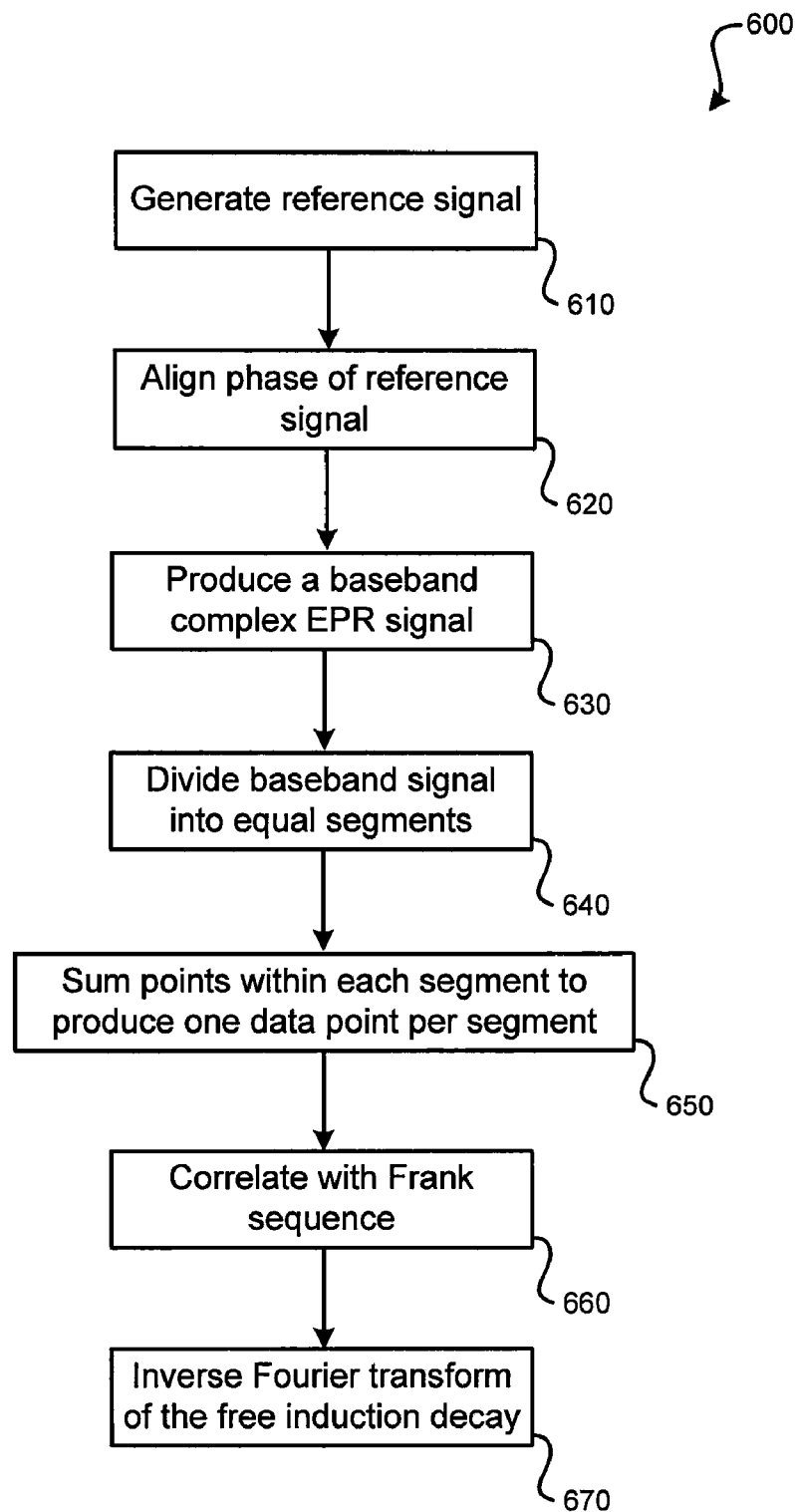
FIG. 6 illustrates a method for detection of a digitized signal.

FIG. 6 illustrates a method 600 for detection of a digitized signal. The following steps, in order to measure and analyze the detection signal, may be performed by a computer system, such as computer system 360 of FIG. 3 or computer system 360-1 of FIG. 4 in conjunction with a system, such as a system illustrated in FIGS. 1-4. At block, 610, a reference signal in the complex form of equation 4 may be generated, wherein f represents the carrier frequency set using the arbitrary waveform generator.

$$r(t)=\exp(j2pft) \quad \text{Eq. 4}$$

At block 620, the phase of the generated reference signal may be aligned to be in phase with the first 32 steps of the Frank sequence which are in the zero reference phase. This may be necessary because of phase delays due to cable lengths and the resonator phase delay that misalign the digitizer trigger with respect to the digitized detection signal. At block 630, to achieve quadrature digital phase-sensitive detection, the signal may be multiplied by the reference and low-pass filtered signals to produce a baseband complex detection signal. The filter parameters may be optimized for the signal bandwidth. At block 640, the baseband signal may then be divided into a number (N) equal segments with a duration according to equation 5, wherein the experimental points within the segment are summed to produce one data point per segment resulting in N data points.

$$dT = \frac{T}{N} \quad \text{Eq. 5}$$

At block 660, This sequence may then be cross-correlated with the Frank sequence in the from of equation 6, wherein ph$_k$ represents the corresponding phases.

$$\exp(j\cdot ph_k), k=1:N \quad \text{Eq. 6}$$

The result of cross-correlation may be the free indication decay (FID) that may represent the detection signal (EPR signal) in the time domain. An inverse Fourier transform, conducted at block 670, of the FID may produce the EPR spectrum in the frequency domain or in the conventional magnetic field domain. Data acquisition and processing may be repeated for an off-resonance magnetic field value. The result, which may represent the background signal, may be subtracted from the signal measured at resonance conditions to produce the final EPR spectrum of the object being studied. Such an EPR spectrum is illustrated in FIG. 5. FIG. 5 is a graph 500 of the EPR spectrum of an organic compound known as OX63. In FIG. 5, line 510 is the absorption component and line 520 is the dispersion component.

Figure 7:
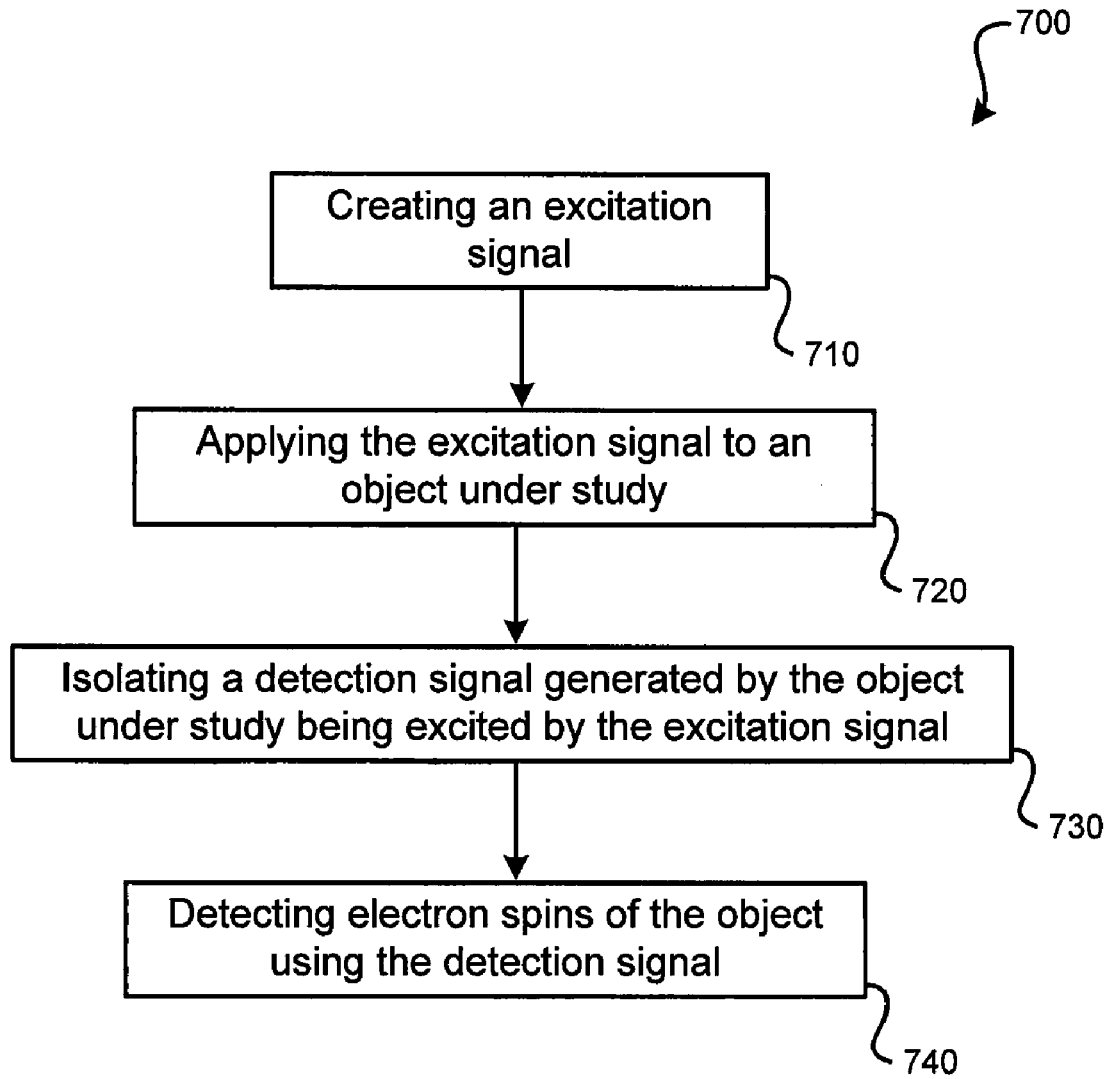
FIG. 7 illustrates a method for measuring electron spins using Electron Paramagnetic Resonance.

FIG. 7 illustrates a method 700 for measuring electron spins using Electron Paramagnetic Resonance. The method 700 may be performed using the systems described in FIGS. 1 through 4. Alternatively, some other system may be used to image electron spins using electron paramagnetic resonance according to method 700. At block 710, an excitation signal may be created. The excitation signal may be created using a Frank sequence. The excitation signal may be created using an arbitrary wave generator (or some other device capable of producing an excitation signal of varying amplitude and/or phase), one or more amplifiers, and/or one or more attenuators. The excitation signal may be a series of pulses or a continuous wave containing phase change intervals.

This excitation signal created at block 710 may be applied to an object being studied at block 720. If the object being studied is in a crossed loop resonator, the excitation signal may be applied to the excitation chamber of the crossed loop resonator. At block 730, a detection signal generated by the unpaired electrons of the object being studied may be isolated from the excitation signal. The detection signal may be isolated using a crossed loop resonator. While the excitation signal may be applied to an excitation chamber of the crossed loop resonator, the detection signal may be isolated using a different chamber of the crossed loop resonator, such as the detection chamber. A crossed-loop resonator may allow for isolation on the order of 60 or 70 dB. Therefore, during, between, or shortly after the application of the RF pulses of the excitation signal have been applied to the object, the detection signal may be observed and measured via the detection chamber of the crossed-loop resonator. Alternatively, if a continuous wave signal is used for the excitation signal containing phase change intervals, the detection signal may be observed and measured while the excitation is being applied. The detection signal, isolated at block 730, may then be used at block 740 to observe and measure electron spins via a detection device.

FIG. 7 illustrates another method 700 for the measuring electron spins using Electron Paramagnetic Resonance. The method 800 may represent the same method as method 700 of FIG. 7. Alternatively, method 800 may represent a different method for measuring electron spins using EPR. At block 810, an excitation signal of varying amplitude and phase may be created using a Frank sequence. Again, the excitation signal may be a series of pulses or a continuous wave signal having phase change intervals. An arbitrary wave generator, or some other device or piece of equipment capable of creating an excitation signal having a varying amplitude and/or phase, may be used to create the excitation signal. If the excitation signal created is of a high enough power, further amplification of the excitation signal may not be necessary. If this is the case, method 800 may proceed from block 810 directly to block 840 (illustrated using a dotted line). In some embodiments, it may be desired that the excitation signal generated at block 810 may be amplified (or attenuated).

If the excitation signal generated at block 810 is to be amplified, the method may proceed to block 820. At block 820, an amplifier may be used to increase the power level of the excitation signal. In some embodiments, more than one amplifier may be used. At block 830, an attenuator, such as a variable attenuator, may be used to reduce the power of the excitation signal. Use of a variable attenuator may allow the power level of the excitation signal to be raised to a maximum power level at block 820, with the variable attenuator being used at block 830 to reduce the power level of the excitation signal to the desired level.

At block 840, the excitation signal may be applied to the object. If the objects is a crossed loop resonator, the excitation signal may be applied to an excitation chamber of the crossed loop resonator. At least a portion of the excitation signal applied to the crossed loop resonator may be absorbed by the object being studied. This may cause some number of unimpaired electrons present in the objects to move to a higher energy level. The electrons may stay in this increased power level for a period of time. The period of time may be very short, such as on the order of 2.5 µs or less.

At block 850, the crossed loop resonator may help to isolate a detection signal generated by the object in the study being excited by the excitation signal. The detection signal may be observed in a second chamber of the crossed loop resonator, such as the detection chamber. At block 860, the detection signal may be amplified. This amplification may be performed by an amplifier, or some other device capable of increasing the magnitude of the detection signal. At block 860, in addition to amplification, other processing of the detection signal may occur. For example, a quadrature mixer may be used to create in-phase and quadrature-phase signals using the detection signal. At block 870, the amplified detection signal may be digitized. This may occur continuously if a continuous wave signal with phase change intervals is being used as the excitation signal. The digitization may be conducted by a Bruker SpecJet digitizer, or some other device capable of digitizing analog signals. At block 880, the digitized detection signal may be transmitted to a computer system. The computer system may perform additional analysis using the digitized detection signal.

Figure 8:
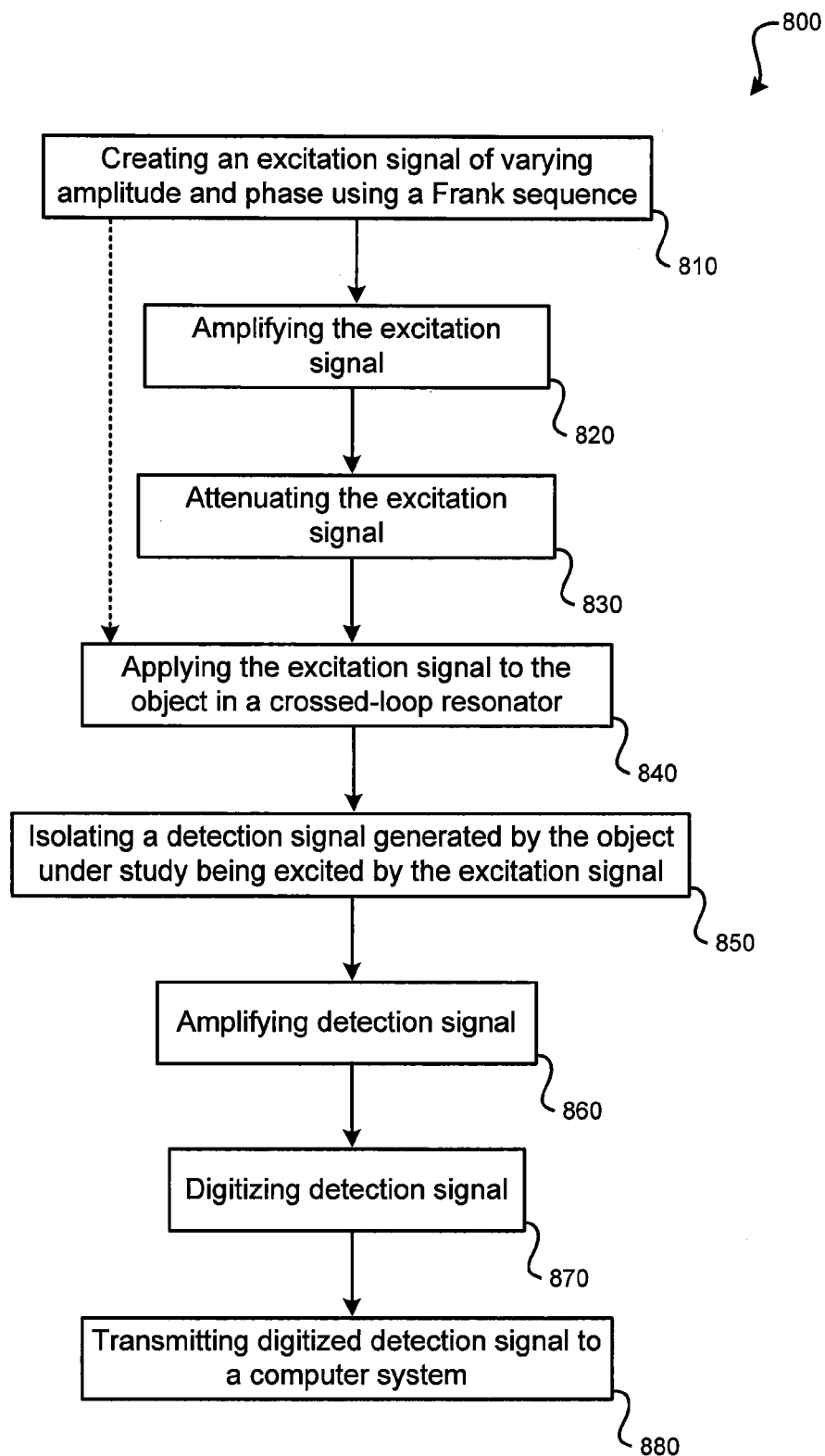
FIG. 8 illustrates another method for measuring electron spins using Electron Paramagnetic Resonance.
Figure 9:
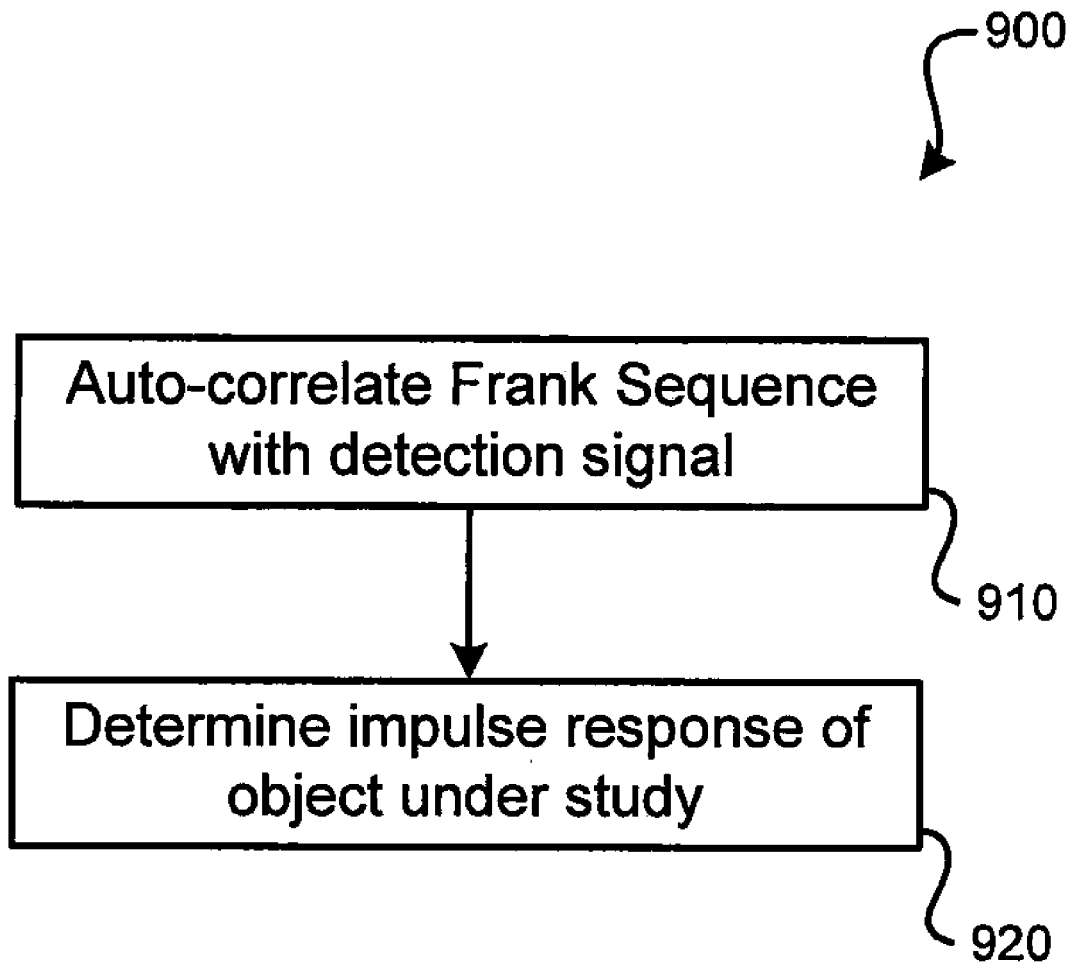
FIG. 9 illustrates a method for determining the free induction decay of the object under study from the detection signal.

FIG. 9 illustrates a method 900 for determining the free induction decay of the object under study using the detection signal. For example, the steps of the method 900 may be performed following the detection signal being received by either the digitizer or the computer system discussed in method 800 of FIG. 8. At block 910, the detection signal may be cross correlated with the Frank sequence introduced to the excitation signal, such as at block 810 of FIG. 8. Following the cross correlation, at block 910, the FID may be determined of the object under study.

Figure 10:
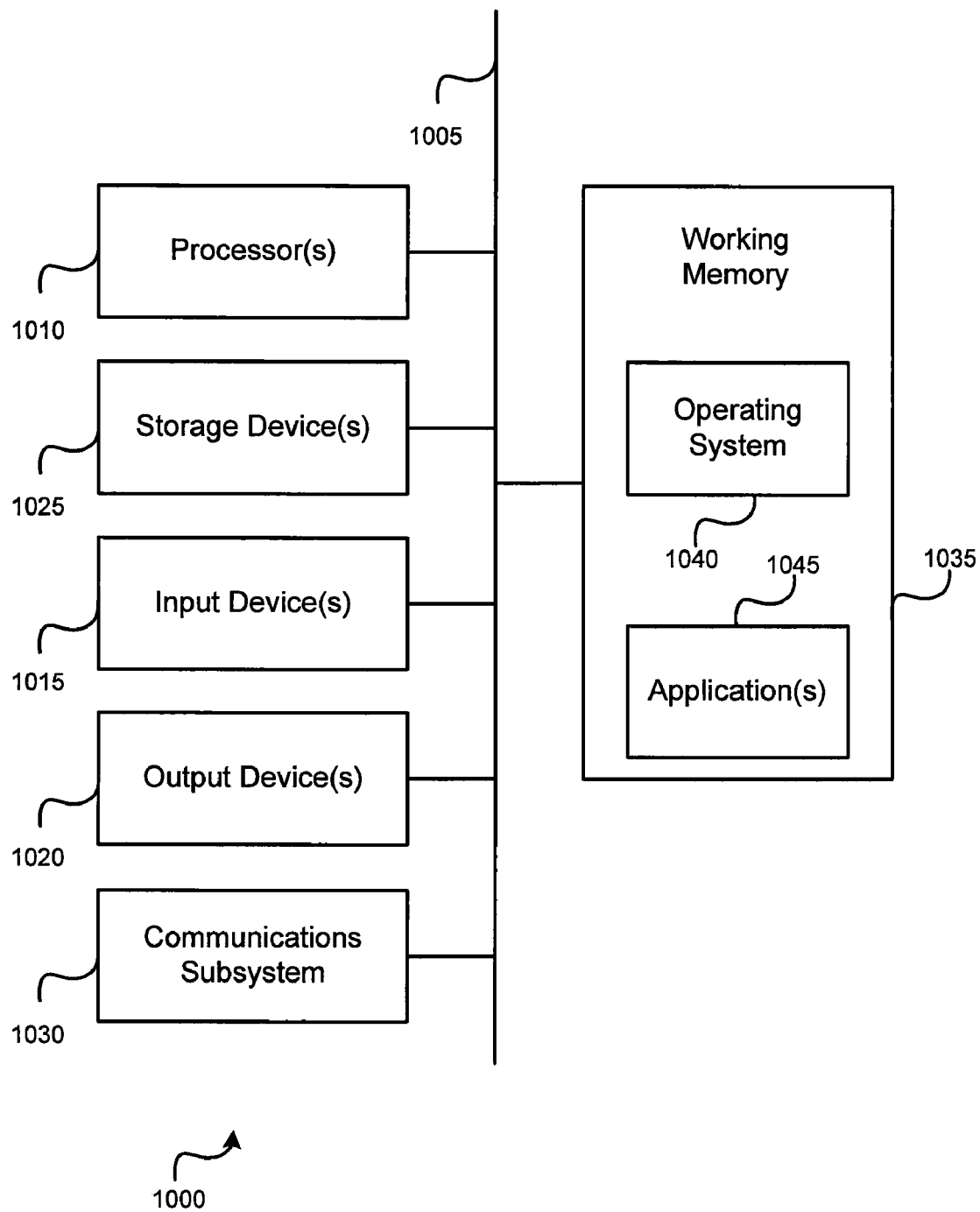
FIG. 10 illustrates a simplified block diagram of a computer system.

To perform the actions of the computer system or any previously mentioned computing devices, a computer system as illustrated in FIG. 10 may be used. FIG. 10 provides a schematic illustration of one embodiment of a computer system 1000 that can perform the methods provided by various other embodiments, as described herein, and/or can function as the host computer system, a remote kiosk/terminal, a point-of-sale device, a mobile device, and/or a computer system. It should be noted that FIG. 10 is meant only to provide a generalized illustration of various components, any or all of which may be utilized as appropriate. FIG. 10, therefore, broadly illustrates how individual system elements may be implemented in a relatively separated or relatively more integrated manner.

The computer system 1000 is shown comprising hardware elements that can be electrically coupled via a bus 1005 (or may otherwise be in communication, as appropriate). The hardware elements may include one or more processors 1010, including without limitation one or more general-purpose processors and/or one or more special-purpose processors (such as digital signal processing chips, graphics acceleration processors, and/or the like); one or more input devices 1015, which can include without limitation a mouse, a keyboard and/or the like; and one or more output devices 1020, which can include without limitation a display device, a printer and/or the like.

The computer system 1000 may further include (and/or be in communication with) one or more non-transitory storage devices 1025, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 1000 might also include a communications subsystem 1030, which can include without limitation a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. The communications subsystem 1030 may permit data to be exchanged with a network (such as the network described below, to name one example), other computer systems, and/or any other devices described herein. In many embodiments, the computer system 1000 will further comprise a working memory 1035, which can include a RAM or ROM device, as described above.

The computer system 1000 also can comprise software elements, shown as being currently located within the working memory 1035, including an operating system 1040, device drivers, executable libraries, and/or other code, such as one or more application programs 1045, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 1025 described above. In some cases, the storage medium might be incorporated within a computer system, such as the system 1000. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 1000 and/or might take the form of source and/or installable code, which, upon compilation and/or installation on the computer system 1000 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer system (such as the computer system 1000) to perform methods in accordance with various embodiments of the invention. According to a set of embodiments, some or all of the procedures of such methods are performed by the computer system 1000 in response to processor 1010 executing one or more sequences of one or more instructions (which might be incorporated into the operating system 1040 and/or other code, such as an application program 1045) contained in the working memory 1035. Such instructions may be read into the working memory 1035 from another computer-readable medium, such as one or more of the storage device(s) 1025. Merely by way of example, execution of the sequences of instructions contained in the working memory 1035 might cause the processor(s) 1010 to perform one or more procedures of the methods described herein.

The terms "machine-readable medium" and "computer-readable medium," as used herein, refer to any medium that participates in providing data that causes a machine to operate in a specific fashion. In an embodiment implemented using the computer system 1000, various computer-readable media might be involved in providing instructions/code to processor(s) 1010 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 1025. Volatile media include, without limitation, dynamic memory, such as the working memory 1035. Transmission media include, without limitation, coaxial cables, copper wire and fiber optics, including the wires that comprise the bus 1005, as well as the various components of the communication subsystem 1030 (and/or the media by which the communications subsystem 1030 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 1010 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1000. These signals, which might be in the form of electromagnetic signals, acoustic signals, optical signals and/or the like, are all examples of carrier waves on which instructions can be encoded, in accordance with various embodiments of the invention.

The communications subsystem 1030 (and/or components thereof) generally will receive the signals, and the bus 1005 then might carry the signals (and/or the data, instructions, etc. carried by the signals) to the working memory 1035, from which the processor(s) 1005 retrieves and executes the instructions. The instructions received by the working memory 1035 may optionally be stored on a storage device 1025 either before or after execution by the processor(s) 1010.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A system for detecting electron spins using electron paramagnetic resonance, the system comprising:
    an excitation signal generator configured to generate an excitation signal of varying amplitude and phase as compared to a reference signal, wherein:
        the excitation signal is generated using a Frank sequence; and
        the power level of the excitation signal is inversely proportion to the resonator effiency to yield $B_1$ sufficient for turning angles of 90°/n;
    a crossed loop resonator configured to isolate a detection signal produced by the excitation signal exciting an object with a magnetic field;

a detection device configured to detect electron spins of the object using the detection signal isolated by the crossed loop resonator;

a first module for cross-correlating the detection signal with the Frank sequence; and a second module for determining a finite impulse decay of the object.

2. The system of claim 1, wherein the detection device is further configured to measure electron spins of the object using the detection signal isolated by the crossed loop resonator within three times $T_2$.

3. The system of claim 1, wherein the detection device is further configured to measure electron spins of the object using the detection signal isolated by the crossed loop resonator less than 5 microseconds after excitation signal has excited the object with the magnetic field.

4. The system of claim 1, wherein the object is placed within the crossed loop resonator.

5. The system of claim 1, wherein the object is an organic object, and the organic object has had a foreign substance introduced to it such that at least a portion of the electron spins of the organic object measured are electron spins of the foreign substance introduced to the organic object.

6. The system of claim 1, wherein the power level of the excitation signal is less than 50 Watts.

7. A method of detecting electron spins using electron paramagnetic resonance, the method comprising:

creating, using a signal generator, a continuous wave excitation signal having a varying phase as compared to a reference signal, wherein:

the continuation wave excitation signal is created using a Frank sequence;

the power level of the continuous wave excitation signal is inversely proportional to the resonator efficiency to yield $B_1$ sufficient for turning angles of 90°/n;

applying the continuous wave excitation signal to an object;

isolating, using an isolation device, a detection signal created by the continuous wave excitation signal exciting the object with a magnetic field;

detecting, using a detection device, electron spins of the object using the detection signal;

cross-correlating the detection signal with the Frank sequence; and determining a finite impulse decay of the object.

8. The method of claim 7, wherein a crossed loop resonator is used to isolate the detection signal created by the excitation signal exciting the object with the magnetic field.

9. The method of claim 7, wherein an amount of time that elapses between applying the excitation signal to the object and detecting electron spins of the object using the detection signal within three times $T_2$.

10. The method of claim 7, wherein the object is an organic object and the method further comprises introducing a foreign substance to the organic object such that at least a portion of the detected electron spins of the organic object are electron spins of the foreign substance introduced to the organic object.

11. A system for detecting electron spins in an object, the system comprising:

means for generating an excitation signal of varying amplitude and phase as compared to a reference signal, wherein:

the excitation signal is generated using a Frank sequence; and the power level of the excitation signal is inversely proportion to the resonator effiency to yield $B_1$ sufficient for turning angles of 90°/n;

means for isolating a detection signal produced when the excitation signal creates a magnetic field that excites electron spins of the object;

means for detecting the detection signal;

means for cross-correlating the detection signal with the Frank sequence; and means for determining a finite impulse decay of the object.

12. The system of claim 11, wherein the detection signal is detected less than 5 microseconds after the excitation signal creates the magnetic field that excited electron spins of the object.

13. The system of claim 11, wherein the excitation signal has a power level of less than 500 Watts when the excitation signal creates the magnetic field that excites electron spins of the object.

14. A system for detecting electron spins using electron paramagnetic resonance, the system comprising:

an excitation signal generator configured to generate an excitation signal of varying amplitude and phase as compared to a reference signal, wherein:

the excitation signal is generated using a Frank sequence;

the power level of the excitation signal is inversely proportion to the resonator effiency to yield $B_1$ sufficient for turning angles of 90°/n; and the excitation signal has a power level of less than 100 Watts;

a resonator configured to isolate a detection signal produced by the excitation signal exciting an object with a magnetic field;

a detection device configured to detect electron spins of the object using the detection signal isolated by the crossed loop resonator;

a first module for cross-correlating the detection signal with the Frank sequence; and a second module for determining a finite impulse decay of the object.

* * * * *

UNITED STATES PATENT AND TRADEMARK OFFICE
CERTIFICATE OF CORRECTION

PATENT NO. : 8,405,393 B2
APPLICATION NO. : 12/942386
DATED : March 26, 2013
INVENTOR(S) : Mark Tseitlin et al.

It is certified that error appears in the above-identified patent and that said Letters Patent is hereby corrected as shown below:

In the Claims:

Claim 1, Column 18, lines 62-63, please delete "proportion" and insert --proportional--.
Claim 1, Column 18, line 63, please delete "effiency" and insert --efficiency--.

Claim 11, Column 20, lines 14-15, please delete "proportion" and insert --proportional--.
Claim 11, Column 20, line 15, please delete "effiency" and insert --efficiency--.

Claim 14, Column 20, lines 40-41, please delete "proportion" and insert --proportional--.
Claim 14, Column 20, line 41, please delete "effiency" and insert --efficiency--.

Signed and Sealed this
Twenty-first Day of May, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,405,393 B2
APPLICATION NO. : 12/942386
DATED : March 26, 2013
INVENTOR(S) : Tseitlin et al.

It is certified that error appears in the above-identified patent and that said Letters Patent is hereby corrected as shown below:

In the Specification

Column 1, Line 12, delete:
"The U.S. Government may have rights to the content of this application as provided for by the terms of Grant Number P41EB002034 awarded by National Institute of Biomedical Imaging and Bioengineering.
Embodiments described herein were supported by Grant Number P41EB002034 awarded by National Institute of Biomedical Imaging and Bioengineering, The content is solely the responsibility of the Applicants and does not necessarily represent the official views of the National Institute of Biomedical Imaging and Bioengineering or the National Institutes of Health."

Column 1, Line 12, and insert:
--This invention was made with government support under Grant Number P41EB002034 awarded by The National Institutes of Health. The government has certain rights in the invention.--

Signed and Sealed this
Twenty-first Day of October, 2014

Michelle K. Lee
*Deputy Director of the United States Patent and Trademark Office*